(12) United States Patent
Kim et al.

(10) Patent No.: US 8,237,354 B2
(45) Date of Patent: Aug. 7, 2012

(54) ORGANIC LIGHT EMITTING DIODE DISPLAY

(75) Inventors: Eun-Ah Kim, Yongin (KR); Noh-Min Kwak, Yongin (KR); Hee-Seong Jeong, Yongin (KR); Joo-Hwa Lee, Yongin (KR); Chul-Woo Jeong, Yongin (KR); Soon-Ryong Park, Yongin (KR); Woo-Suk Jung, Yongin (KR); Hee-Chul Jeon, Yongin (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 136 days.

(21) Appl. No.: 12/511,902

(22) Filed: Jul. 29, 2009

(65) Prior Publication Data

US 2010/0052521 A1 Mar. 4, 2010

(30) Foreign Application Priority Data

Aug. 26, 2008 (KR) ........................ 10-2008-0083395

(51) Int. Cl.
*H01L 51/52* (2006.01)

(52) U.S. Cl. ........ 313/504; 345/173; 313/503; 313/512; 313/506

(58) Field of Classification Search ............... 257/40, 257/72, 98–100, 642–643, 759; 313/498–512; 315/169.1, 169.3; 427/58, 64, 66, 532–535, 427/539; 428/690–691, 917; 438/26–29, 438/34, 82, 455; 445/24–25; 345/173
See application file for complete search history.

(56) References Cited

U.S. PATENT DOCUMENTS 5,736,973 A * 4/1998 Godfrey et al. ............... 345/102
(Continued)

FOREIGN PATENT DOCUMENTS

CN 1488976 A 4/2004
(Continued)

OTHER PUBLICATIONS

Certificate and Announcement of Patent for Invention dated May 4, 2011 for Chinese Patent No. ZL 2009 1 0165267.5 which corresponds to the captioned application U.S. Appl. No. 12/511,902.

*Primary Examiner* — Mariceli Santiago
*Assistant Examiner* — Donald Raleigh
(74) *Attorney, Agent, or Firm* — Knobbe, Martens, Olson & Bear LLP

(57) ABSTRACT

An organic light emitting diode (OLED) display is provided. The OLED display includes: a substrate member; an OLED that includes a pixel electrode that is formed on the substrate member, an organic light emitting layer that is formed on the pixel electrode, and a transflective common electrode that is formed on the organic light emitting layer; an encapsulation thin film that is formed on the transflective common electrode; and a touch panel that includes a first touch conductive layer that is formed on the encapsulation thin film and that is formed with a transflective metal film, a glass substrate that is formed on the first touch conductive layer, and a second touch conductive layer that is formed on the glass substrate. In some embodiments, the transflective common electrode has reflectivity of less than 50%. Some of the external light is thus reflected again to the first touch conductive layer and back to the transflective common electrode and so on. During this cycling, destructive interference occurs and the cycled light eventually dissipates. Thus, unwanted reflected light is suppressed.

13 Claims, 3 Drawing Sheets

U.S. PATENT DOCUMENTS

| | | | |
|---|---|---|---|
| 6,424,094 B1 * | 7/2002 | Feldman | 315/169.3 |
| 2003/0127973 A1 * | 7/2003 | Weaver et al. | 313/504 |
| 2005/0269962 A1 | 12/2005 | Matsunaga | |
| 2006/0266640 A1 * | 11/2006 | Halsey et al. | 204/192.29 |
| 2007/0216296 A1 | 9/2007 | Kim et al. | |
| 2007/0242055 A1 * | 10/2007 | Lai | 345/173 |
| 2008/0122348 A1 * | 5/2008 | Jeong et al. | 313/504 |
| 2008/0290796 A1 * | 11/2008 | Chan et al. | 313/504 |

FOREIGN PATENT DOCUMENTS

| | | |
|---|---|---|
| JP | 08-147092 A | 6/1996 |
| JP | 2003-233329 A | 8/2003 |
| JP | 2004-145878 | 5/2004 |
| JP | 2008-152640 A | 7/2008 |
| KR | 10-2006-0058610 A | 5/2006 |

* cited by examiner

ORGANIC LIGHT EMITTING DIODE DISPLAY

CROSS-REFERENCE TO RELATED APPLICATIONS

This application claims priority to and the benefit of Korean Patent Application No. 10-2008-0083395 filed in the Korean Intellectual Property Office on Aug. 26, 2008, the entire contents of which are incorporated herein by reference.

BACKGROUND

1. Field of the Invention

The present invention relates to an organic light emitting diode (OLED) display. More particularly, the present invention relates to an OLED display including a touch panel.

2. Description of the Related Art

A typical OLED display includes a plurality of organic light emitting diodes having a hole injection electrode, an organic emission layer, and an electron injection electrode. Light is emitted as excitons are generated. The excitons are generated as electrons and holes are combined and drop from an excited state to a ground state. The OLED display displays an image by using the light resulting from these excitons.

Accordingly, an OLED display has self-luminance characteristics, and unlike a liquid crystal display (LCD), the thickness and a weight thereof can be reduced since a separate light resource is not required. Further, OLED displays are used in various applications, such as displays in mobile electronic devices, because an OLED display has low power consumption, high luminance, and high reaction speed. Furthermore, OLED displays with a touch panel have become widely used.

However, the hole injection electrode and an electron injection electrode in the OLED display and several other metal wires can reflect light from the outside. This reflection can deteriorate an OLED's display characteristics, such as black color expression and contrast.

In order to compensate for the reflection of external light, some known OLED displays employ a polarizing plate and a phase delay plate to suppress the reflected light. However, in conventional OLEDs, use of a polarizing plate and a phase delay plate can cause a considerable amount of loss of light that is generated in the organic emission layer of the OLED. Furthermore, in conventional OLEDs, use of a polarizing plate and a phase delay plate may make the OLED device overly thick and unsuitable for use with a touch panel.

The above information disclosed in this Background section is only for enhancement of understanding of the background of the invention and therefore it may contain information that does not form the prior art that is already known in this country to a person of ordinary skill in the art.

SUMMARY

Embodiments of the present invention provide an OLED display having improved visibility by suppressing reflection of external light, such as ambient light. In addition, embodiments of the present invention can provide an OLED display having suitable thickness for use with a touch panel.

An exemplary embodiment of the present invention provides an OLED display including: a substrate member; an OLED that includes a pixel electrode that is formed on the substrate member, an organic light emitting layer that is formed on the pixel electrode, and a transflective common electrode that is formed on the organic light emitting layer; an encapsulation thin film that is formed on the transflective common electrode; and a touch panel that includes a first touch conductive layer that is formed on the encapsulation thin film and that is formed with a transflective metal film, a glass substrate that is formed on the first touch conductive layer, and a second touch conductive layer that is formed on the glass substrate.

The transflective common electrode may have reflectivity of less than 50%. The transflective common electrode may be made of a co-deposited material including at least one of magnesium (Mg) and silver (Ag). Furthermore, in the OLED display, the transflective common electrode may be formed with a metal film of at least one of magnesium (Mg), silver (Ag), calcium (Ca), lithium (Li), and aluminum (Al).

The encapsulation thin film may have an average refractive index of 1.6 or more. The encapsulation thin film may have a thickness in a range of 400 Å to 1300 Å. The encapsulation thin film may be formed by alternately stacking a plurality of organic films and inorganic films.

The first touch conductive layer may have a thickness in a range of 50 Å to 150 Å. The first touch conductive layer may include any one of magnesium (Mg), silver (Ag), calcium (Ca), lithium (Li), chromium (Cr), and aluminum (Al). Surfaces of the encapsulation thin film may closely contact the transflective common electrode and the first touch conductive layer, respectively.

DETAILED DESCRIPTION OF SOME EMBODIMENTS

Figure 1:
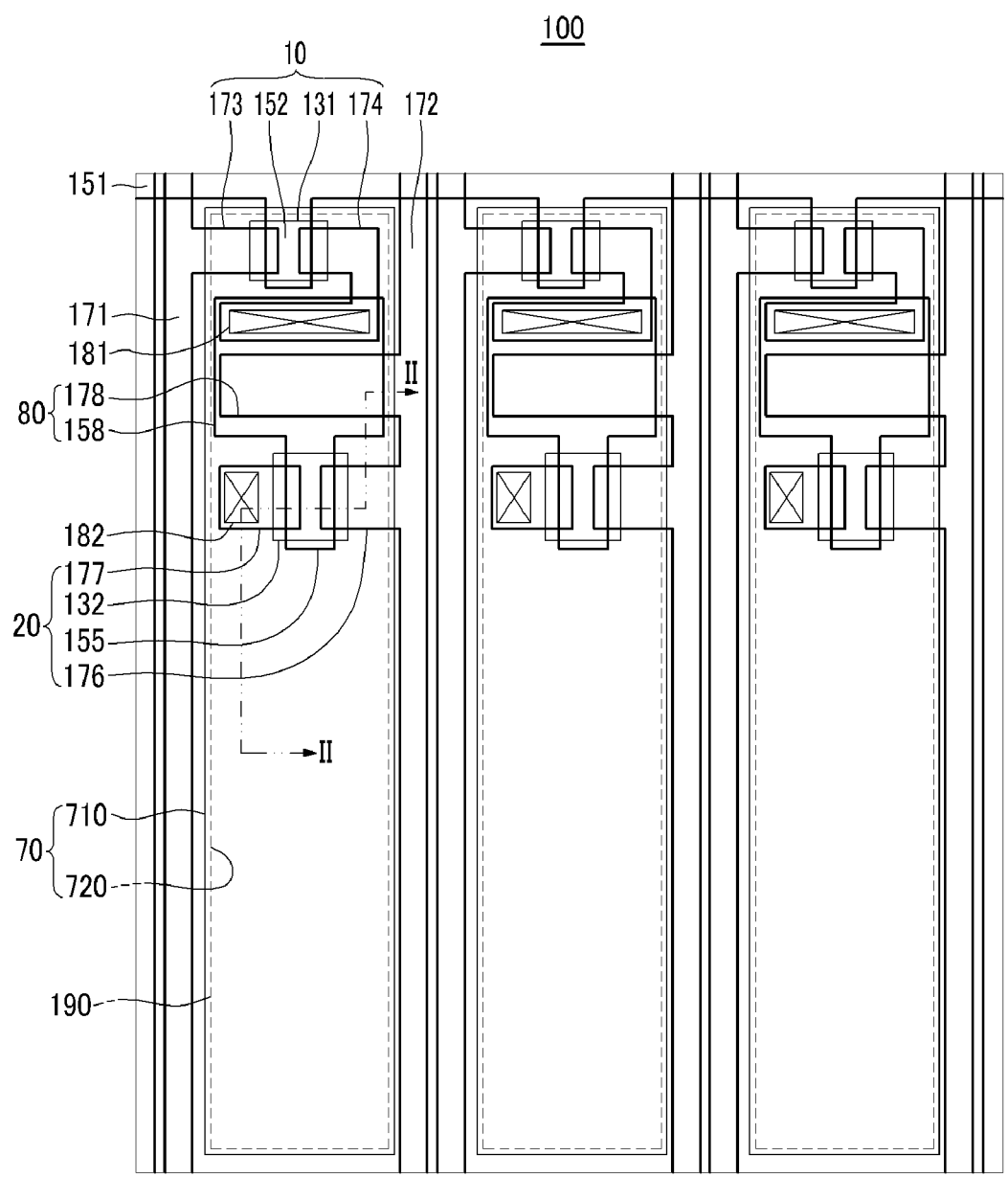
FIG. 1 is a layout view of an OLED display according to a first exemplary embodiment of the present invention.

The present invention will be described with reference to the accompanying drawings, in which exemplary embodiments of the invention are shown. Those skilled in the art will realize that the described embodiments may be modified in various different ways, all without departing from the spirit or scope of the present invention. Constituent elements having the same configuration are representatively described with reference to one or more embodiments. Other exemplary embodiments may then be described by referring to various differences between the embodiments.

The drawings and description are to be regarded as illustrative in nature and not restrictive. Like reference numerals designate like elements throughout the specification.

In the drawings, the thickness of layers, films, panels, regions, etc., may be exaggerated for clarity. In addition, the size and the thickness of each element in the drawing are provided for better understanding and ease of description of various embodiments and are not intended to limit the present invention. For example, it should be understood that when an element, such as a layer, film, region, or substrate is referred to as being "on" another element, it can be directly on the other element or intervening elements may also be present. When an element is referred to as being "directly on" another element, there are no intervening elements present.

In the accompanying drawings, an organic light emitting diode (OLED) display is illustrated. For purposes of illustration, an active matrix (AM)-type OLED display is shown having a 2Tr-1Cap structure in which two thin film transistors (TFTs) and one capacitor are formed in one pixel. But, the embodiments of the present invention are not limited thereto. Other OLED display embodiments consistent with the present invention can have various structures. For example, three or more TFTs and two or more capacitors can be provided in one pixel of an OLED display, and separate wires can be further provided in the OLED display.

One skilled in the art will recognize that the term pixel can refer to a minimum unit for displaying an image. An OLED display displays an image by using a plurality of pixels, and thus, has a plurality of pixel areas.

An embodiment of the present invention will now be described with reference to FIGS. 1 to 3. As shown in FIG. 1, the OLED display 100 can include a switching TFT 10, a driving TFT 20, an organic light emitting diode (OLED) 70 in one pixel, and a capacitor 80. The OLED display 100 further includes a gate line 151 that is disposed along one direction, a data line 171 that is insulated from and intersects the gate line 151, and a common power line 172. In the example shown, the boundary of one pixel may be defined by the gate line 151, the data line 171, and the common power line 172. Further, the OLED display 100 further includes an encapsulation thin film 800 (shown in FIG. 2) and a touch panel 90 (shown in FIG. 2).

In general, the switching TFT 10 operates by a gate voltage that is applied to the gate line 151. The switching TFT 10 transfers a data voltage applied to the data line 171 to the driving TFT 20. Capacitor 80 stores a voltage corresponding to a difference between a common voltage applied from the common power line 172 to the driving TFT 20 and a data voltage transferred from the switching TFT 10. From the capacitor 80, a current flows to the OLED 70 through the driving TFT 20, which causes the OLED 70 emits light. Some of these components will now be further described.

The switching TFT 10 includes a switching semiconductor layer 131, a switching gate electrode 152, a switching source electrode 173, and a switching drain electrode 174. The switching TFT 10 is used as a switch for selecting a pixel to emit light. The switching gate electrode 152 is connected to the gate line 151. The switching source electrode 173 is connected to the data line 171. The switching drain electrode 174 is separated from the switching source electrode 173 and is connected to the first sustain electrode 158.

The driving TFT 20 applies driving power and enables the organic emission layer 720 of the OLED 70 within the selected pixel to emit light to the pixel electrode 710. The driving TFT 20 includes a driving semiconductor layer 132, a driving gate electrode 155, a driving source electrode 176, and a driving drain electrode 177. The driving gate electrode 155 is connected to the first sustain electrode 158. Each of the driving source electrode 176 and the second sustain electrode 178 is connected to the common power line 172. The driving drain electrode 177 is connected to the pixel electrode 710 of the OLED 70 through a contact hole 182.

The OLED 70 includes a pixel electrode 710, an organic emission layer 720 that is formed on the pixel electrode 710, and a transflective common electrode 730 (shown in FIG. 2) that is formed on the organic emission layer 720. Here, the pixel electrode 710 is a positive (+) electrode, which is a hole injection electrode. The transflective common electrode 730 is a negative (−) electrode, which is an electron injection electrode. However, the present invention is not limited thereto. For example, the pixel electrode 710 may be a cathode, and the transflective common electrode 730 may be an anode.

Holes and electrons are injected into the organic emission layer 720 from the pixel electrode 710 and the transflective common electrode 730, respectively. Excitons are generated when injected holes and electrons are coupled and fall from an excited state to a ground state. Light is then emitted when the excitons are generated.

The capacitor 80 includes a first sustain electrode 158 and a second sustain electrode 178 with a gate insulating layer 140 (shown in FIG. 2) disposed therebetween.

A structure of the OLED display 100 will now be described further with reference to FIG. 2. As shown in FIG. 2, an OLED display 100 includes the driving TFT 20, the OLED 70, and the capacitor 80, and also includes an encapsulation thin film 800 and a touch panel 90. In the embodiment shown, the driving TFT 20 is a TFT having a PMOS structure and using a P-type impurity. However, the present invention is not limited thereto. For example, the TFT 20 can also be an NMOS structure TFT or a CMOS structure TFT.

Figure 2:
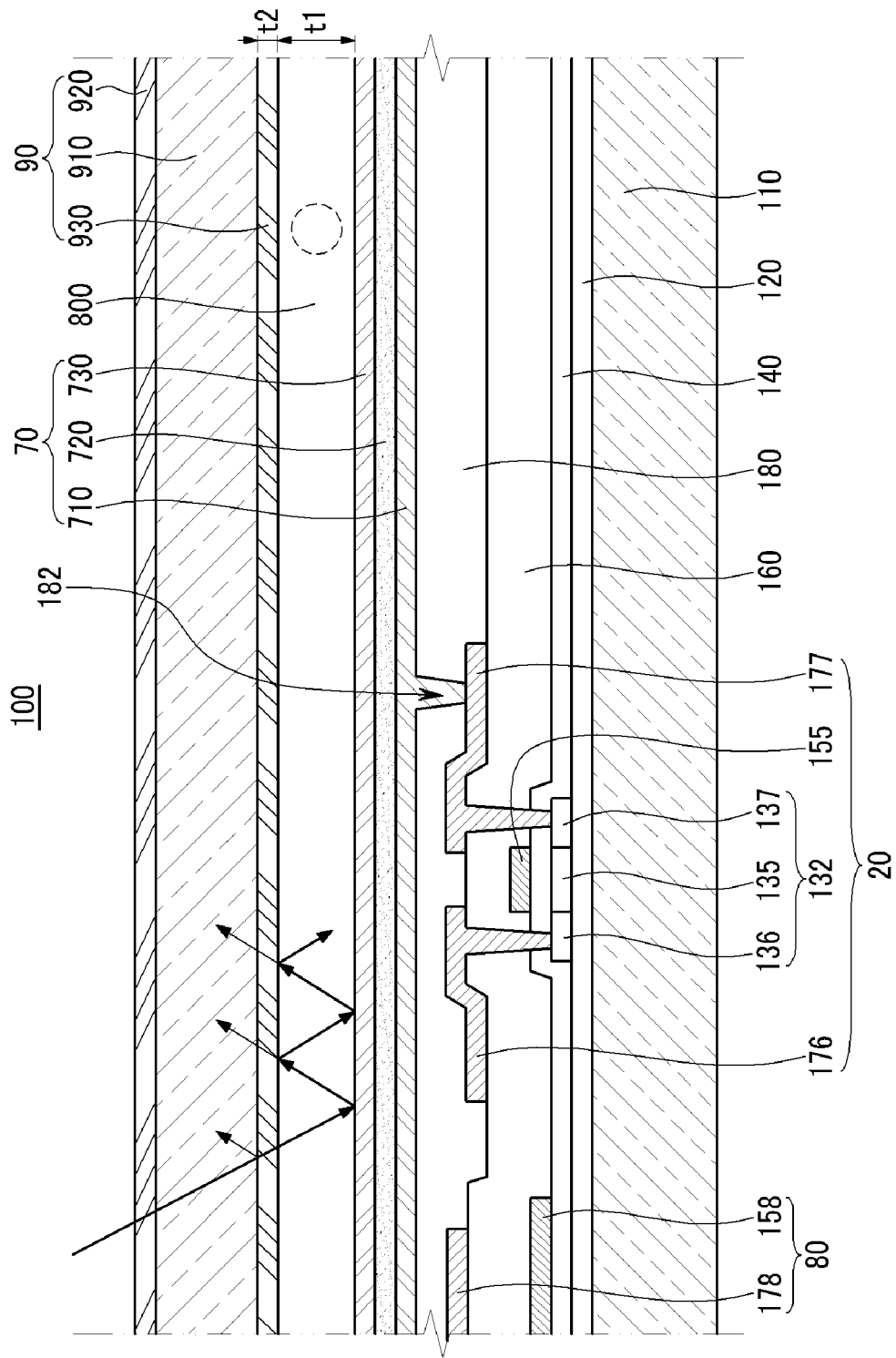
FIG. 2 is a cross-sectional view of the OLED display taken along line II-II of FIG. 1.

Furthermore, the driving TFT 20 that is shown in FIG. 2 is a polycrystal TFT including a polysilicon film. The switching TFT 10 (not shown in FIG. 2) may be a polycrystal TFT or an amorphous TFT having an amorphous silicon film. Some of the other differences between the switching TFT 10 and the driving TFT 20 may also be apparent from the figures.

In the driving TFT 20, the substrate member 110 is formed with an insulation substrate consisting of glass, quartz, ceramic, plastic, etc. However, the present invention is not limited thereto. For example, the substrate member 110 may be formed with a metal substrate like stainless steel.

A buffer layer 120 is formed on the substrate member 110. The buffer layer 120 can prevent penetration of impurities into the substrate member 112 and may provide a planarization surface. The buffer layer 120 may be made of various materials that can perform these functions. For example, the buffer layer 120 may include any one of a silicon nitride (SiNx) film, a silicon oxide ($SiO_2$) film, and a silicon oxynitride (SiOxNy) film. The buffer layer 120 is not always necessary, and thus, may be omitted in some embodiments according to the type and process conditions of the substrate member 110 used.

The driving TFT 20 also includes a driving semiconductor layer 132, a driving gate electrode 155, a driving source electrode 176, and a driving drain electrode 177. One skilled in the art will recognize that the configuration of the driving TFT 20 is not limited to the described examples, but can be variously changed into other configurations.

The driving semiconductor layer 132 is formed on the buffer layer 120. The driving semiconductor layer 132 is formed with a polysilicon film. Further, the driving semiconductor layer 132 includes a channel region 135 in which impurities are not doped. The source region 136 and a drain region 137 may be formed with doping of p+ at both sides of the channel region 135. The doped ion material can be a P-type impurity, such as boron (B) material like $B_2H_6$. Different impurities can be employed according to the kind of TFT used.

A gate insulating layer 140 that is made of silicon nitride SiNx or silicon oxide $SiO_2$ is formed on the driving semiconductor layer 132. A gate wire including the driving gate electrode 155 is formed on the gate insulating layer 140. The gate wire further includes the gate line 151 (shown in FIG. 1), the first sustain electrode 158, and other wires. The driving gate electrode 155 is formed to be overlapped with at least a part of the driving semiconductor layer 132, particularly, a channel region 135.

An interlayer insulating layer 160 for covering the driving gate electrode 155 is formed on the gate insulating layer 140. The gate insulating layer 140 and the interlayer insulating layer 160 have through-holes for exposing a source region 136 and a drain region 137 of the driving semiconductor layer 132. The interlayer insulating layer 160 is made of silicon nitride (SiNx) or silicon oxide ($SiO_2$), etc., as in the gate insulating layer 140.

A data wire is formed on the interlayer insulating layer 160 and includes a driving source electrode 176 and a driving drain electrode 177. The data wire further includes the data line 171 (shown in FIG. 1), the common power line 172, the second sustain electrode 178, and other wires. The driving source electrode 176 and the driving drain electrode 177 are connected to the source region 136 and the drain region 137, respectively, of the driving semiconductor layer 132 through the through-holes.

A planarization layer 180 for covering the data wires 172, 176, 177, and 178 is formed on the interlayer insulating layer 160. The planarization layer 180 performs a function of removing a step and planarizing in order to raise light emitting efficiency of the OLED 70 to be formed thereon. Further, the planarization layer 180 has a contact hole 182 for exposing a part of the drain electrode 177.

The planarization layer 180 may be made of at least one of a polyacrylate resin, an epoxy resin, a phenolic resin, a polyamide resin, a polyimide resin, an unsaturated polyester resin, a poly phenylenether resin, a poly phenylenesulfide resin, and a benzocyclobutene (BCB).

A pixel electrode 710 of the OLED 70 is formed on the planarization layer 180. The pixel electrode 710 is connected to the drain electrode 177 through the contact hole 182 of the planarization layer 180.

Further, a pixel defined layer 190 having an opening for exposing the pixel electrode 710 is formed on the planarization layer 180. The pixel defined layer 190 may be made of a polyacrylate resin and a polyimide resin, or a silica-based inorganic material. The pixel electrode 710 is disposed to correspond to the opening of the pixel defined layer 190. Therefore, a portion in which the pixel defined layer 190 is formed is substantially equivalent to the remaining portion, except for a portion in which the pixel electrode 710 is formed.

The OLED 70 can be formed from a pixel electrode 710, an organic emission layer 720, and a transflective common electrode 730. The organic emission layer 720 is formed on the pixel electrode 710. The transflective common electrode 730 is formed on the organic emission layer 720.

The organic emission layer 720 is made of a low molecular organic material or a high molecular organic material. The organic emission layer 720 may include multiple layers. For example, the organic emission layer 720 may include a hole injection layer (HIL), a hole-transporting layer (HTL), an emission layer, an electron-transporting layer (ETL), and an electron-injection layer (EIL). The HIL is disposed on the pixel electrode 710, which is an anode. The HTL, the emission layer, the ETL, and the EIL may then be sequentially stacked thereon.

The OLED display 100 may be a front light emission type. Accordingly, the pixel electrode 710 may be made of a reflective conductive material like lithium (Li), calcium (Ca), lithium fluoride/calcium (LiF/Ca), lithium fluoride/aluminum (LiF/Al), aluminum (Al), silver (Ag), magnesium (Mg), or gold (Au). However, the pixel electrode 710 may include other types of layers including a transparent conductive layer, a reflective layer, or a transflective material.

In one embodiment, the transflective common electrode 730 has a reflectivity of less than 50%. Any material that has a reflectivity of less than 50% and transflects light can be used as the transflective common electrode 730.

An encapsulation thin film 800 is formed on the transflective common electrode 730. The encapsulation thin film 800 serves as a protection and covers and seals the TFT 20 and the OLED 70 from the outside. The encapsulation thin film 800 may have an average refractive index equal to or greater than 1.6 and a thickness t1 in a range of 400 Å to 1300 Å. Further, as shown in FIG. 3, the encapsulation thin film 800 can include a plurality of organic films 820 and inorganic films 810 that are alternately stacked.

Figure 3:
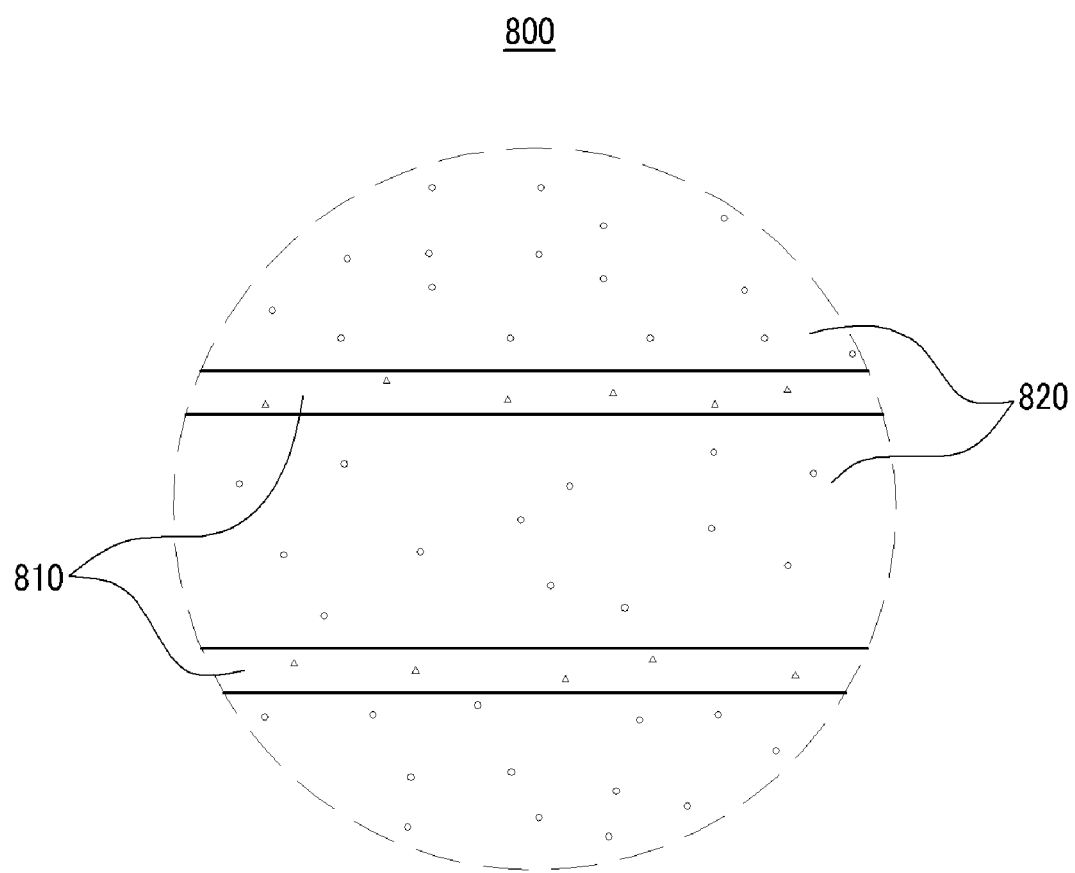
FIG. 3 is an enlarged cross-sectional view of a dotted line circle of FIG. 2.

Reference will now be made to FIG. 3, which is an enlarged cross-sectional view of a dotted line circle of FIG. 2. As shown in FIG. 3, the organic film 820 may be made of polymer and the inorganic film may be made of aluminum oxide ($Al_2O_3$). Through such a configuration, the encapsulation thin film 800 can stably cover the OLED 70 while having a relatively thin thickness t1.

On the encapsulation thin film 800, a first touch conductive layer 930, a touch glass substrate 910, and a second touch conductive layer 920 are sequentially formed. Here, the first touch conductive layer 930, the touch glass substrate 910, and the second touch conductive layer 920 form a touch panel 90.

In some embodiments, the touch panel 90 uses a capacitance method. The touch panel 90 is formed by coating a transparent special conductive metal on both surfaces of the touch glass substrate 910 and forming the first touch conductive layer 930 and the second touch conductive layer 920. If a voltage is applied to four corners of the touch panel 90, a high frequency is spread on a surface of the touch panel 90. When the touch panel 90 is touched, a controller analyzes the changed high frequency waveform and recognizes the location of the touch point.

The first touch conductive layer 930 includes any one of magnesium (Mg), silver (Ag), calcium (Ca), lithium (Li), chromium (Cr) and aluminum (Al). Further, the first touch conductive layer 930 can have a thickness t2 of a range of 50 Å to 150 Å.

In such a configuration, both surfaces of the encapsulation thin film 800 are in relatively close proximity to the transflective common electrode 730 and the first touch conductive layer 930, respectively. This proximity of the interface may be close enough such that air does not substantially exist between the encapsulation thin film 800, the transflective common electrode 730, and the first touch conductive layer 930. Accordingly, the transflective common electrode 730, the encapsulation thin film 800, and the first touch conductive layer 930 can also be useful in suppressing the reflection of external light.

The manner in which these components can suppress the reflection of external light will now be further described. First, when external light passes through the touch panel 90, some of this light is reflected from the first touch conductive layer 930 back to the outside of the device. However, some of the light may advance toward the transflective common electrode 730 via the encapsulation thin film 800.

As described above, because the transflective common electrode 730 has reflectivity of less than 50%, some of the injected light is reflected again to the first touch conductive layer 930. Some of light is emitted back to the outside after passing through the first touch conductive layer 930. The remaining portion is reflected again and advances toward the transflective common electrode 730. Therefore, this causes a cycling of light from the outside using the reflection between the transflective common electrode 730 and the first touch conductive layer 930 with the encapsulation thin film 800 interposed therebetween.

During this cycling, destructive interference occurs and the light eventually dissipates. Therefore, in some embodiments, the encapsulation thin film 800 has a refractive index of greater than or equal to 1.6 and has a thickness t1 of a range of 400 Å to 1300 Å. However, destructive interference of light may occur with other configurations.

Equation 1 may be useful in explaining the principle of destructive interference of the reflected light employed in the embodiments. In particular, Equation 1 may be expressed as:

$$d=\lambda/4Nd\cos\theta$$

where

"d" is a distance between two reflection surfaces, i.e. a thickness of an encapsulation thin film;
"N" is a refractive index of an encapsulation thin film;
"θ" is an incidence angle of light; and
"λ" is a wavelength of reflected light.

For example, assuming a wavelength of green visible light and an incidence angle of 30° to 45°, the application of Equation 1 indicates that an encapsulation thin film thickness t1 in a range of 400 Å to 1500 Å may be an effective thickness for promoting destructive interference of light.

Further, the thickness t2 of the first touch conductive layer 930 is set to effectively transflect light. For example, by closely disposing the transflective common electrode 730, the encapsulation thin film 800, and the first touch conductive layer 930, the reflection of external light can be substantially suppressed. Thus, the OLED display 100 can have improved visibility.

Further, the encapsulation thin film 800 may be formed with a relatively thin thickness t1 and may avoid use of a polarizing plate and a phase delay plate, which are conventionally used for suppressing reflection of external light. Therefore, since it can omit these components, the OLED display 100 may have a reduced thickness even though it includes the touch panel 90.

In some embodiments, the transflective common electrode 730 is made of a co-deposited material including at least one of magnesium (Mg) and silver (Ag). These materials may be used in order to increase the suppression of reflected external light.

In yet other embodiments, the transflective common electrode 730 is formed with a metal film of at least one of magnesium (Mg), silver (Ag), calcium (Ca), lithium (Li), and aluminum (Al). That is, the transflective common electrode 730 may be formed with one metal film and may be formed with a structure having a stack of a plurality of metal films. This configuration may be used in order to increase the suppression of reflected external light.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   a substrate member;
   an OLED that comprises a pixel electrode that is formed on the substrate member, an organic light emitting layer that is formed on the pixel electrode, and a transflective common electrode that is formed on the organic light emitting layer;
   an encapsulation thin film that is formed on the transflective common electrode and that covers and seals the OLED from the environment; and
   a touch panel that comprises a first touch conductive layer that is formed on the encapsulation thin film and that is formed with a transflective metal film, a glass substrate that is formed on the first touch conductive layer, and a second touch conductive layer that is formed on the glass substrate, wherein the first and second touch conductive layers are substantially thinner than the glass substrate, and wherein the encapsulation thin film is interposed between and contacts the transflective common electrode and the first touch conductive layer.

2. The OLED display of claim 1, wherein the transflective common electrode has reflectivity of less than 50%.

3. The OLED display of claim 2, wherein the encapsulation thin film has an average refractive index of 1.6 or more.

4. The OLED display of claim 3, wherein the encapsulation thin film has a thickness in a range of 400 Å to 1300 Å.

5. The OLED display of claim 4, wherein the encapsulation thin film is formed by alternative stacking of a plurality of organic films and inorganic films.

6. The OLED display of claim 4, wherein the first touch conductive layer has a thickness in a range of 50 Å to 150 Å.

7. The OLED display of claim 6, wherein the first touch conductive layer comprises any one of magnesium (Mg), silver (Ag), calcium (Ca), lithium (Li), chromium (Cr), and aluminum (Al).

8. The OLED display of claim 1, wherein both surfaces of the encapsulation thin film closely contact the transflective common electrode and the first touch conductive layer, respectively.

9. The OLED display of claim 1, wherein the touch panel is formed in a capacitance method.

10. The OLED display of claim 2, wherein the transflective common electrode is made of a co-deposited material comprising at least one of magnesium (Mg) and silver (Ag).

11. The OLED display of claim 2, wherein the transflective common electrode is formed with a metal film of at least one of magnesium (Mg), silver (Ag), calcium (Ca), lithium (Li), and aluminum (Al).

12. The OLED display of claim 1, wherein the first touch conductive layer is substantially thinner than the encapsulation thin film.

13. The OLED display of claim 1, wherein the thickness of the first touch conductive layer is set to effectively transflect light.

* * * * *